US006977338B1

United States Patent
Muro et al.

(10) Patent No.: US 6,977,338 B1
(45) Date of Patent: Dec. 20, 2005

(54) WIRING BOARD AND MAGNETIC DISK APPARATUS

(75) Inventors: Kiyomi Muro, Hachioji (JP); Norihiro Ishii, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/145,064

(22) Filed: Jun. 6, 2005

(30) Foreign Application Priority Data

Jul. 28, 2004 (JP) ............................ 2004-219979

(51) Int. Cl.⁷ ............................................. H01L 23/28
(52) U.S. Cl. .................... 174/52.2; 174/52.4; 257/730; 257/737; 257/778; 257/787
(58) Field of Search ............................ 174/52.2, 52.4; 257/687, 730, 737, 778, 787

(56) References Cited

U.S. PATENT DOCUMENTS

| 5,535,101 | A | * | 7/1996 | Miles et al. | 361/808 |
| 5,821,456 | A | * | 10/1998 | Wille et al. | 174/52.2 |
| 6,248,951 | B1 | * | 6/2001 | Murali et al. | 174/52.2 |
| 6,353,182 | B1 | * | 3/2002 | Chang et al. | 174/52.2 |
| 6,552,263 | B2 | * | 4/2003 | Farquhar et al. | 174/52.2 |
| 6,649,833 | B1 | * | 11/2003 | Caletka et al. | 174/52.2 |
| 6,674,016 | B2 | * | 1/2004 | Kubo et al. | 174/260 |
| 6,680,436 | B2 | * | 1/2004 | Xu et al. | 174/52.2 |
| 6,809,262 | B1 | * | 10/2004 | Hsu | 174/52.2 |

FOREIGN PATENT DOCUMENTS

JP 2002-110712 4/2002

* cited by examiner

*Primary Examiner*—Hung V. Ngo
(74) *Attorney, Agent, or Firm*—Pillsbury Winthrop Shaw Pittman LLP

(57) ABSTRACT

A wiring board is constructed such that a base layer constituted of photosensitive polyimide, a conductor layer constituted of copper, and a cover layer constituted of photosensitive polyimide are formed in this order on a stainless layer. On an electronic part mounting portion, a plurality of lands are formed so as to correspond to electrode terminals of an electronic part to be mounted. On the periphery of the electronic part mounting portion, an underfill diffusion preventing portion formed by removing the cover layer in a trench shape is provided so as to surround the periphery thereof.

12 Claims, 8 Drawing Sheets

WIRING BOARD AND MAGNETIC DISK APPARATUS

CROSS-REFERENCE TO THE INVENTION

This application is based upon and claims the benefit of priority from the prior Japanese Patent Application No. 2004-219979, filed on Jul. 28, 2004; the entire contents of which are incorporated herein by reference.

BACKGROUND OF THE INVENTION

1. Field of the Invention

The present invention relates to a wiring board and a magnetic disk apparatus, and particularly relates to a wiring board that is preferable for a small magnetic disk apparatus and the like and a magnetic disk apparatus having such a wiring board.

2. Description of the Related Art

Along with the sophistication in performance and the reduction in size and weight of portable devices and electronic devices, miniaturization is required also in a magnetic disk apparatus as a representative apparatus for storing a large volume of digital information. For such a small magnetic disk apparatus, the size of a disk enclosure itself storing a disk and so on is small, and each wiring board equipped therein is also required to respond to miniaturization.

In a wiring board as described above, in order to respond to narrowing down of a pitch between electrodes, solder balls are often used for connecting electrodes of an electronic part and electrodes on the wiring board when mounting an electronic part such as a semiconductor chip on the wiring board. In this case, if a force such as stress during temperature cycling caused by difference in coefficient of linear expansion between the wiring board and an electric part, dropping impact, bending or the like is applied, concentration of stress occurs at solder junction points, which may cause connection failure. Accordingly, it is known to fill an underfill constituted of resin or the like into a space between the electronic part such as a semiconductor chip and the wiring board so as to reinforce the solder junction points. Further, in order to stop the flow of this underfill, it is known to form a frame constituted of copper foil that the same material as the electrode (for example, refer to Japanese Patent Laid-open Application No. 2002-110712).

In order to respond to miniaturization of magnetic disk apparatuses, further microfabrication of wiring patterns in a wiring board is in progress. Conventionally, such a wiring board is fabricated by a method in which a cover layer (polyimide layer for example), conductor layer, reinforcing plate and the like are formed respectively in a predetermined shape by metal molding or the like and bonded together by an adhesive. However, in such a fabricating method, owing to displacement of bonding, limitation in design due to minimum processing restriction by a metal mold and the like, demand for high density design that is required in a wiring board for miniaturized magnetic disk apparatus cannot be satisfied.

Thus, the present inventors have developed a new fabricating method using a new material, that is, a fabricating method in which a liquid photosensitive polyimide is used to repeatedly perform exposing, developing, curing and so on in sequence so as to form respective layers constituting a wiring board sequentially. According to this fabricating method, the metal molding is not necessary and the displacement of bonding does not occur, so that the demand for high density design can be satisfied.

However, when the material different from that of a prior wiring board is used to fabricate a wiring board as described above, it has been found that a problem arises such that difference in wettability of the surface of a wiring board is generated, and thus the underfill diffuses circumferentially when it is filled into the space between the electronic part and the wiring board, which results in a high possibility of causing production failure.

SUMMARY OF THE INVENTION

Accordingly, an advantage of the present invention is to provide a highly reliable wiring board and magnetic disk apparatus, which are capable of responding to a high density design and preventing diffusion of underfill even when wettability of the surface of a wiring board is high.

In order to achieve the above-described object, an aspect of a wiring board according to the present invention includes: a conductor pattern formed in a predetermined shape; a cover layer formed to cover the conductor pattern; an electronic part mounting portion having electric connection portions formed thereon for electric connection of electrodes of an electronic part and the conductor pattern, with an underfill being filled into a space between the mounted electronic part and the cover layer; and an underfill diffusion preventing portion constructed by forming a portion where the cover layer is removed in a trench shape to thereby surround the entire periphery of the electronic part mounting portion.

Further, an aspect of a magnetic disk apparatus according to the present invention includes: a wiring board which has a conductor pattern formed in a predetermined shape, a cover layer formed to cover the conductor pattern, an electronic part mounting portion having electric connection portions formed thereon for electric connection of electrodes of an electronic part and the conductor pattern, with an underfill being filled into a space between the mounted electronic part and the cover layer, and an underfill diffusion preventing portion constructed by forming a portion where the cover layer is removed in a trench shape to thereby surround the entire periphery of the electronic part mounting portion; a head carriage connected electrically to the wiring board, the head carriage having a magnetic head mounted thereon and configured to perform input/output of electric signals; and a magnetic disk on which reading/writing of magnetic information are performed by the magnetic head mounted on the head carriage.

DESCRIPTION OF THE EMBODIMENTS

Embodiments of the preset invention will be described in detail with reference to the drawings.

Figure 1:
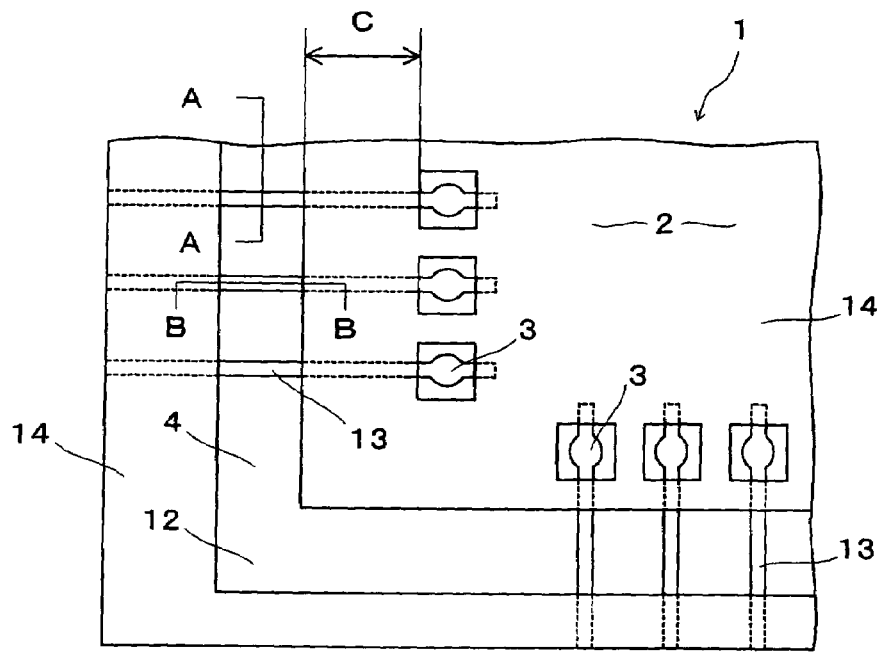
FIG. 1 is a view showing a schematic structure of a substantial part of a wiring board according to an embodiment of the present invention.
Figure 2:
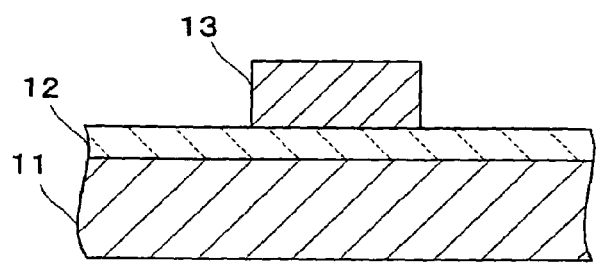
FIG. 2 is a view showing an A—A cross sectional structure of the wiring board of FIG. 1.
Figure 3:
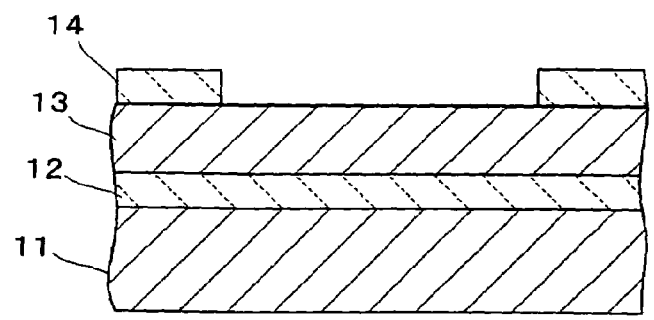
FIG. 3 is a view showing a B—B cross sectional structure of the wiring board of FIG. 1.

FIGS. 1 to 4 shows a schematic structure of a substantial part of a wiring board according to an embodiment of the present invention, FIG. 2 shows the structure of an A—A cross section in FIG. 1, and FIG. 3 shows the structure of a B—B cross section in FIG. 1.

As shown in FIGS. 2 and 3, the wiring board 1 is constructed such that a base layer 12 constituted of photosensitive polyimide, a conductor layer 13 constituted of copper, and a cover layer 14 constituted of photosensitive polyimide are formed in this order on a stainless layer 11. Specifically, the base layer 12 is formed by applying liquid photosensitive polyimide on the stainless layer 11 and by exposing, developing, heating and curing and so on via a photomask in a predetermined pattern. Further, the conductor layer 13 is formed by forming a seed layer on the entire surface of the base layer 12 (for example, chrome as a base and copper thereon), forming a mask in a predetermined pattern on the seed layer by a photoresist, and forming a copper layer on positions where the photoresist is not present by electrolytic copper plating. Incidentally, the photoresist and the excess seed layer are removed after the electrolytic copper plating. Further, similarly to the above-described base layer 12, the cover layer 14 is formed by applying, exposing, heating and curing and so on of the liquid photosensitive polyimide.

Figure 4:
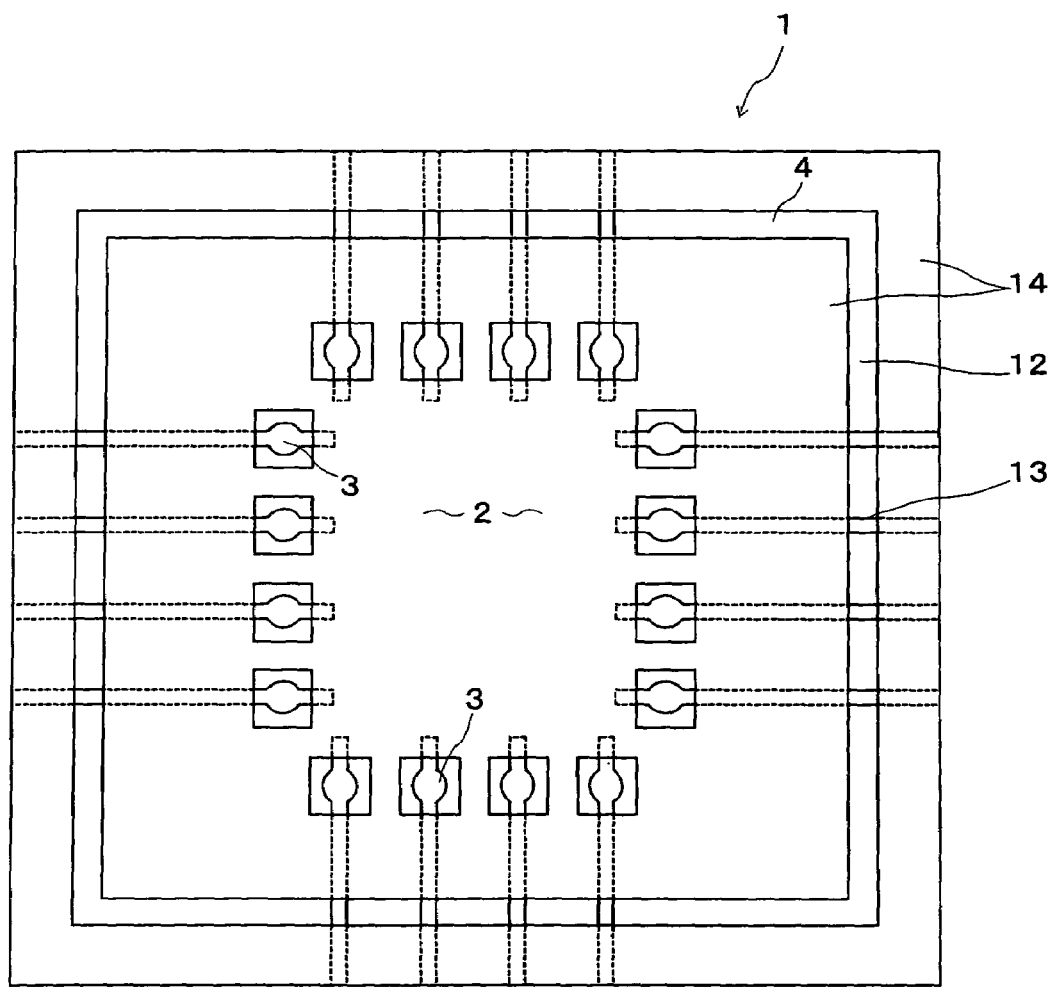
FIG. 4 is a view showing the overall structure of an underfill diffusion preventing portion of the wiring board of FIG. 1.
Figure 5:
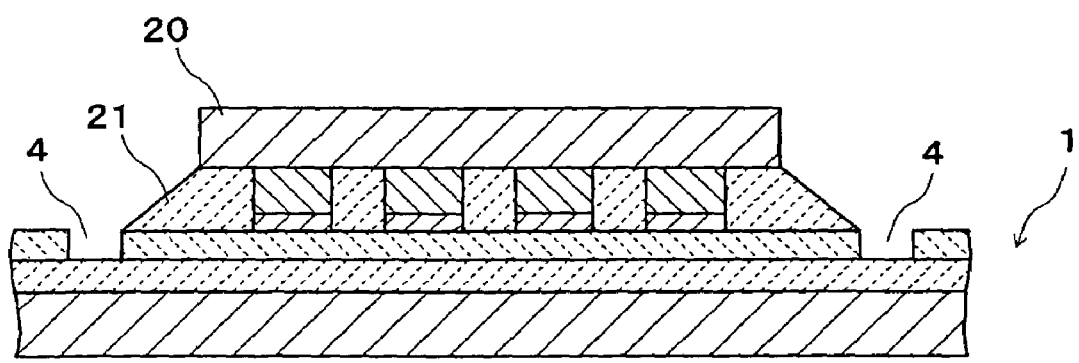
FIG. 5 is a view showing an electronic part mounting state of the wiring board of FIG. 1.

In FIGS. 1 and 4, 2 is an electronic part mounting portion where an electronic part such as a semiconductor chip is mounted. On this electronic part mounting portion 2, a plurality of lands 3 are formed sequentially on the conductor layer 13 so as to correspond to electrode terminals (solder balls) of an electronic part to be mounted, the lands 3 being electric connection portions with these electrode terminals. Portions of the cover layer 14 on these lands 3 are removed, thereby forming in the cover layer 14 opening portions corresponding to the lands 3.

On the periphery of the electronic part mounting portion 2, as shown in FIG. 3, an underfill diffusion preventing portion 4 formed by removing the cover layer 14 in a trench shape is provided so as to surround the entire periphery thereof. This underfill diffusion preventing portion 4 is patterned by exposing and developing steps in a forming step of the above-described cover layer 14. As actual dimensions, a gap (C in FIG. 1) between the inside of the underfill diffusion preventing portion 4 and the outside of the opening portions of the cover layer 14 for the lands 3 is approximately 110 to 130 $\mu$m for example, and the width of a trench portion is approximately 75 to 100 $\mu$m for example. According to the above-described fabricating method, even such a miniaturized pattern can be formed with high precision.

The wiring board 1 has a structure such that the cover layer 14 on the conductor layer 13 in the underfill diffusion preventing portion 4 is removed as shown in FIGS. 2 and 3. Accordingly, the wiring board 1 is in a state that the copper is exposed, and thus it is preferable to form a coating layer (for example, a gold layer, an Ni base layer and a gold layer, an Sn—Cu layer, and the like) on the conductor layer 13 in this portion by electrolytic plating or the like. Thus, corrosion of the copper, scattering of the copper to the outside and the like can be prevented.

On the wiring board 1 with the above-described structure, an electronic part 20 is mounted on the electronic part mounting portion 2, and an underfill 21 is filled into a space between the electronic part 20 and the wiring board 1. At this time, wettability of the cover layer 14 is so high that the underfill 21 begins to diffuse from the electronic part mounting portion 2 toward the periphery thereof, but when it reaches an edge portion of the underfill diffusion preventing portion 4, it tends to stop diffusion at this edge portion of the trench structure since the physical structure of the surface on this portion is different and discontinuous.

In other words, the underfill 21 diffuses to the periphery when the underfill diffusion preventing portion 4 does not exist, but when the underfill diffusion preventing portion 4 is provided, the underfill tends to stop diffusion at the edge portion of the trench structure thereof by its own surface tension, without flowing into the trench structure.

In this embodiment, by the effect of this underfill diffusion preventing portion 4, the diffusion of underfill 21 can be prevented even when wettability of the surface of the cover layer 14 is high, and therefore a highly reliable wiring board 1 that is capable of responding to a high density design can be provided.

Figure 6:
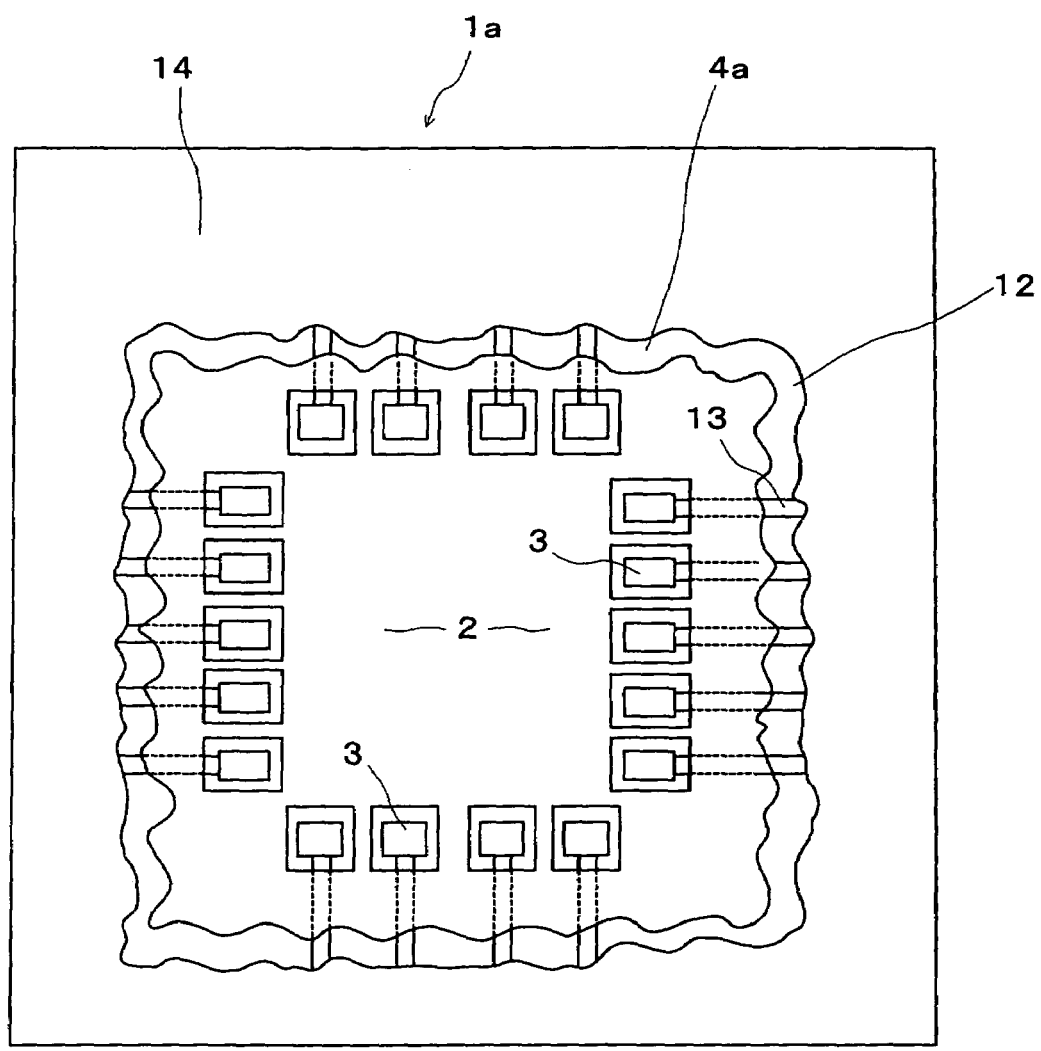
FIG. 6 is a view showing a schematic structure of a substantial part of a wiring board according to another embodiment of the present invention.

FIG. 6 shows a schematic structure of a substantial part of a wiring board 1a according to another embodiment. In this wiring board 1a, a trench structure constituting an underfill diffusion preventing portion 4a is formed not in a linear shape as shown in FIG. 1 but in a non-linear shape (curving shape). In the wiring board 1a with such a structure, the length of the edge portion of the underfill diffusion preventing portion 4a can be made longer as compared to the case of forming in a linear shape. By making the length of this edge portion longer, the effect to prevent diffusion of underfill in the underfill diffusion preventing portion 4a can be enhanced. It should be noted that the curving state of the trench structure is not limited to the shape shown in FIG. 6, but as a matter of course, it may be any shape that is non-linear.

Figure 7:
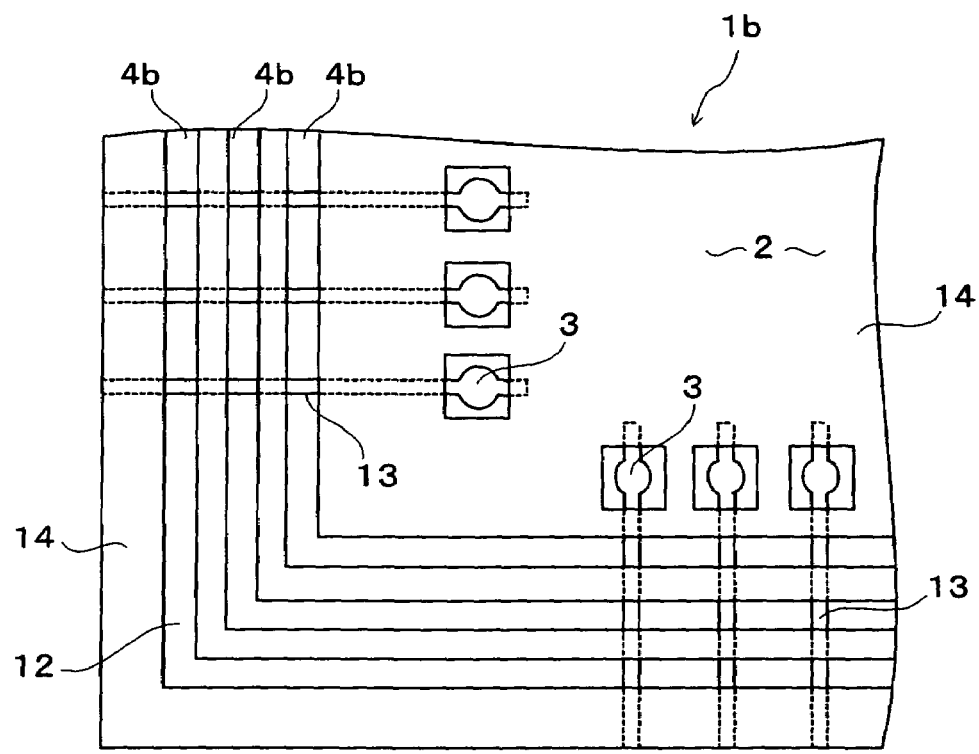
FIG. 7 is a view showing a schematic structure of a substantial part of a wiring board according to another embodiment of the present invention.

FIG. 7 shows a substantial structure of a wiring board 1b according to another embodiment. In this wiring board 1b, an underfill diffusion preventing portion 4b is constituted of a plurality (three (triple) in FIG. 7) of trench structures. As already described, the effect of preventing diffusion of underfill occurs at an edge portion of a trench structure. It has been found from experiments and the like that when the underfill once enters the trench from the edge portion, it diffuses relatively easily to the other side. Accordingly, rather than making the width of the trench structure wider, making a plurality of trench structures, even with a narrow width, to form the underfill diffusion preventing portion 4b similarly to the wiring board 1b can further enhance the effect of preventing the diffusion of underfill.

Figure 8:
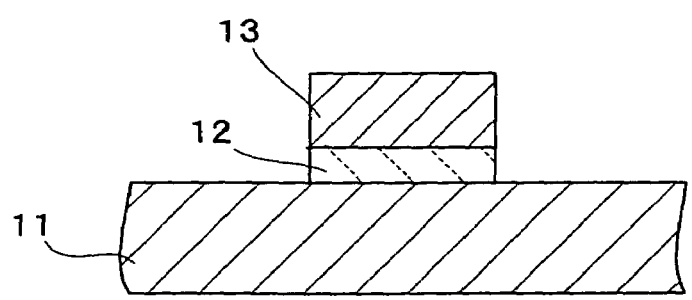
FIG. 8 is a view showing a cross sectional structure of a wiring board according to another embodiment of the present invention.

In the foregoing, the case of underfill diffusion preventing portions 4, 4a, 4b being a trench structure in which only the cover layer 14 is removed has been described. However, as shown in FIG. 8, it may be a trench structure in which for example the base layer 12 is also removed in addition to the cover layer 14. In this case, it is possible to achieve the effect of preventing diffusion of underfill owing to the depth of the trench structure being made deeper as well as the effect of preventing diffusion of underfill owing to the change in material of the base portion of the trench structure from the base layer 12 with high wettability to the stainless layer 11.

Figure 9:
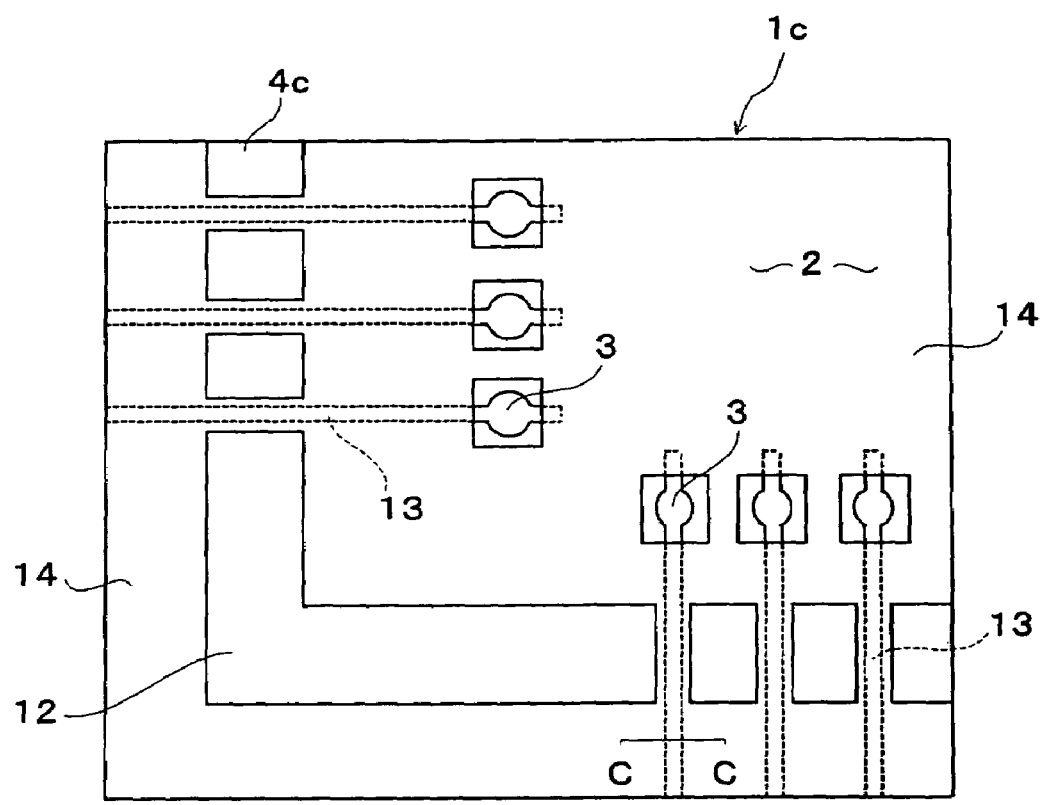
FIG. 9 is a view showing a schematic structure of a substantial part of a wiring board according to another embodiment of the present invention.
Figure 10:
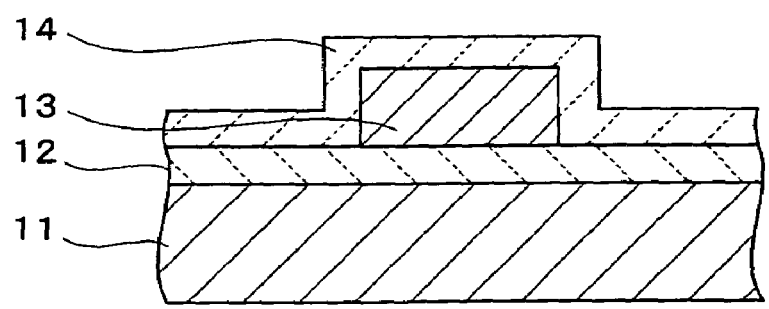
FIG. 10 is a view showing a C—C cross sectional structure of the wiring board of FIG. 9.

Also, in the foregoing, the case of forming the trench structure along the entire periphery of the electronic part mounting portion 2 has been described, but as shown in FIG. 9, an underfill diffusion preventing portion 4c can also be provided excluding portions where the conductor layer 13 passes through. In this case, there is a possibility that the underfill diffuses through the portions where the conductor layer 13 passes through. However, as shown in FIG. 10 (showing a C—C cross section in FIG. 9), a portion of the cover layer 14 where the conductor layer 13 passes through is higher in height than the other portion thereof. Accordingly, the possibility of the diffusion of underfill through the portions where the conductor layer 13 passes through is lower than the possibility of the diffusion through the other portion (lower portion) thereof. Therefore, also in this structure, the effect of preventing the diffusion of underfill can be achieved. Further, with this structure, the cover layer 14 remains on the conductor layer 13, and thus it is not necessary to form the above-described cover layer, which allows simplification of the manufacturing process. It should be noted that, also in this structure, a plurality of trench structures may be arranged multiply, or the trench structure may be non-linear as described above.

Figure 11:
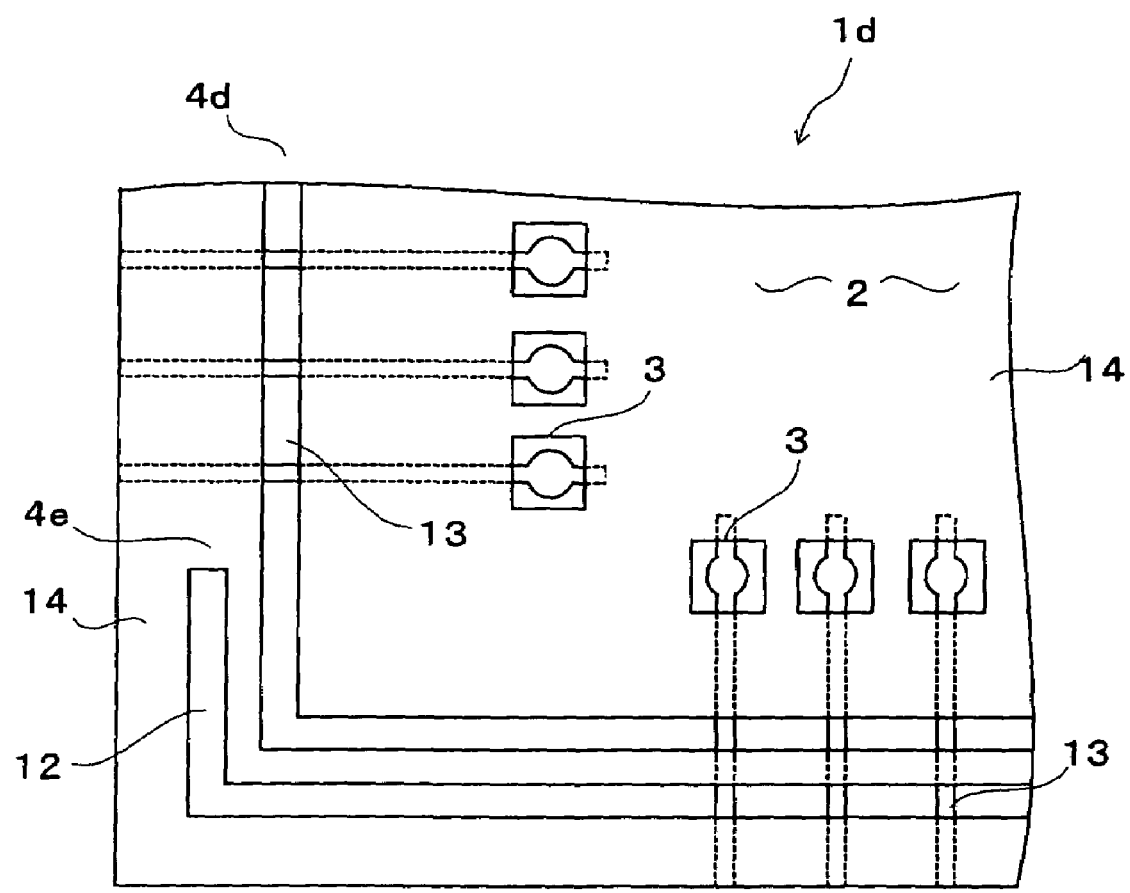
FIG. 11 is a view showing a schematic structure of a substantial part of a wiring board according to another embodiment of the present invention.

Also, as a wiring board 1d shown in FIG. 11, in addition to an underfill diffusion preventing portion 4d with a trench structure formed over the entire periphery of the electronic part mounting portion 2, a partial underfill diffusion preventing portion 4e with a trench structure formed partially on an outer side thereof may be provided. This partial underfill diffusion preventing portion 4e is, for example, provided in a direction particularly where the diffusion of underfill must be surely prevented, such as a direction where an electronic part is mounted adjacently. Accordingly, diffusion of underfill toward a predetermined direction can be surely prevented.

Figure 12:
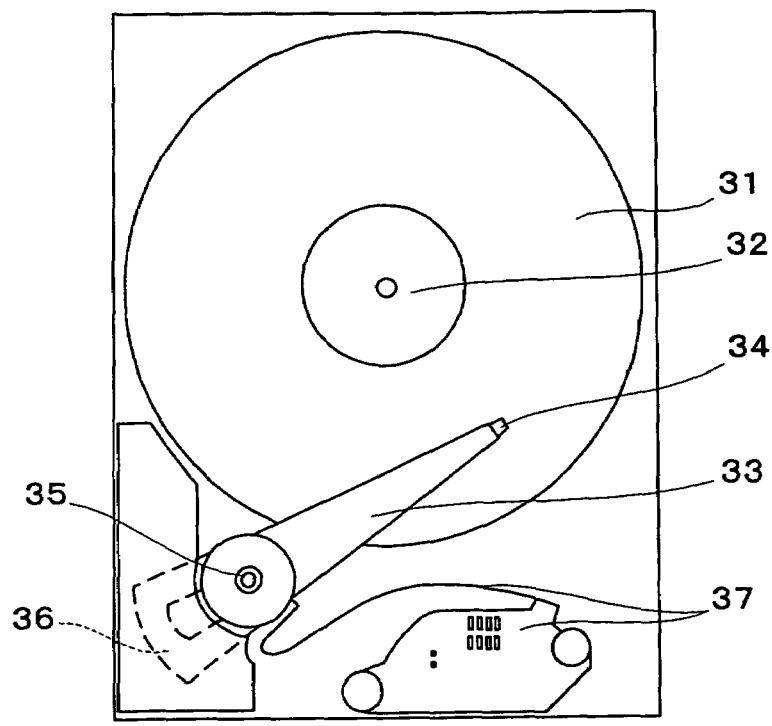
FIG. 12 is a view showing the structure of a magnetic disk apparatus according to an embodiment of the present invention.

Next, the structure of a magnetic disk apparatus having a wiring board with the above-described structure will be explained. As shown in FIG. 12, the magnetic disk apparatus has a magnetic disk 31, a disk clamper 32, a head carriage 33, a magnetic head 34, a pivot 35, a voice coil motor 36, and a head carriage communication wiring board 37. The size of the entire magnetic disk apparatus is, for example, 32 mm in length and 24 mm in width.

The magnetic disk 31 is a disk-shaped medium for retaining information as a magnetic pattern in a circumferential direction, and writing/reading of magnetic signals are performed by the magnetic head 34 provided on a tip of the head carriage 33 which moves in the radial direction thereof. The disk clamper 32 fastens and fixes the center of rotation of the magnetic disk 31 to a spindle motor (not-shown) provided on an underside thereof. The head carriage 33 moves the magnetic head 34 provided on its tip in the radial direction while lifting the magnetic head 34 above the magnetic disk.

The magnetic head 34 is configured to convert electric signals to magnetic signals for writing of information to the magnetic disk 31, and to convert magnetic signals to electric signals for reading of information from the magnetic disk 31. Electric signals for writing/reading are transmitted mutually from/to the head carriage communication wiring board 37 connected to the head carriage 33. The pivot 35 rotatably supports the head carriage 33 as the center of movement (rotation) of the head carriage 33. The voice coil motor 36 is a drive source to rotate the head carriage 33 with the pivot 35 being a center.

The head carriage communication wiring board 37 is configured to communicate with (connected to) the head carriage 33 and transmit signals which are mutually sent to/received from the magnetic head 34. These signals may include a signal for the voice coil motor 36. As shown in the view, the head carriage communication wiring board 37 also has a portion which functions as a cable mainly for transmitting signals and changes its bending state by rotation of the head carriage 33, and a region which has a shape that is fixed continuously to the portion and is mainly for mounting an electronic part.

Figure 13:
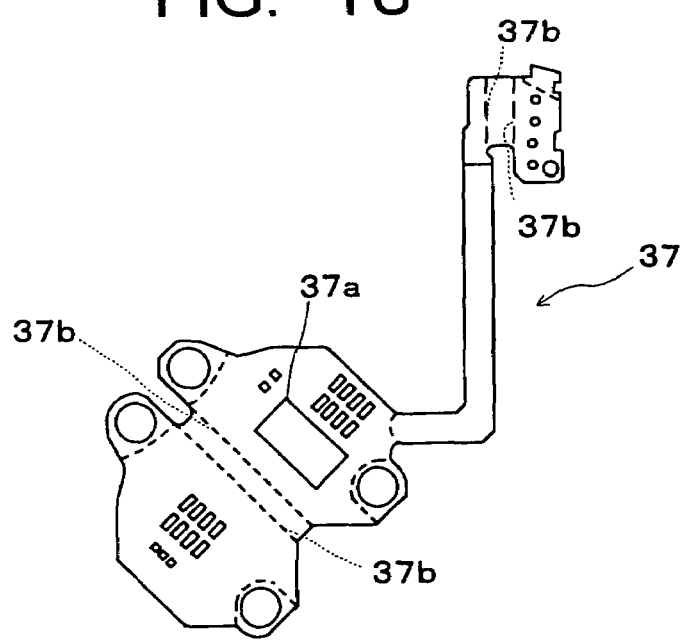
FIG. 13 is a view showing the structure of a head carriage communication wiring board of the magnetic disk apparatus of FIG. 12.

In such a magnetic disk apparatus, the head carriage communication wiring board 37 is a wiring board according to the above-described embodiments. FIG. 13 is a plan view showing only the structure of the head carriage communication wiring board 37 shown in FIG. 12. As shown in FIG. 13, on the head carriage communication wiring board 37, a stainless layer 37b (the stainless layer 11 in the above-described FIG. 2 and soon) are provided partially. These regions are not necessary to have flexibility but for increasing mechanical stiffness, and thus the stainless layer 37b is removed from a portion where flexibility is needed (a portion that bends in accordance with movement of the head carriage 33, or the like).

On a portion where the stainless layer 37b is formed, an electronic part 37a such as a semiconductor chip or the like is mounted, and on the periphery of this electronic part mounting portion, the above-described underfill diffusion preventing portion 4 (not shown in FIG. 13) and so on are provided. By the effect of this underfill diffusion preventing portion 4, diffusion of underfill can be prevented even when wettability of the surface thereof is high, and therefore a highly reliable magnetic disk apparatus that is capable of responding to a high density design can be provided.

What is claimed is:

1. A wiring board, comprising:
   a conductor pattern formed in a predetermined shape;
   a cover layer formed to cover said conductor pattern;
   an electronic part mounting portion having electric connection portions formed thereon for electric connection of electrodes of an electronic part and said conductor pattern, with an underfill being filled into a space between the mounted electronic part and said cover layer; and
   an underfill diffusion preventing portion constructed by forming a portion where said cover layer is removed in a trench shape to thereby surround the entire periphery of said electronic part mounting portion.

2. A wiring board as set forth in claim 1,
   wherein said underfill diffusion preventing portion is formed to be at least double.

3. A wiring board as set forth in claim 1,
   wherein said underfill diffusion preventing portion is formed in a non-linear shape.

4. A wiring board as set forth in claim 1, further comprising:

a partial underfill diffusion preventing portion constructed on an outer side of said underfill diffusion preventing portion by forming a portion where said cover layer is removed in a trench shape only on a part of the periphery of said electronic part mounting portion.

5. A wiring board as set forth in claim 1,
wherein said cover layer is constituted of photosensitive polyimide.

6. A wiring board as set forth in claim 1,
wherein said conductor pattern is formed on a base layer, and said underfill diffusion preventing portion is constructed by removing said cover layer and said base layer in a trench shape.

7. A magnetic disk apparatus, comprising:
a wiring board which comprises: a conductor pattern formed in a predetermined shape, a cover layer formed to cover said conductor pattern, an electronic part mounting portion having electric connection portions formed thereon for electric connection of electrodes of an electronic part and said conductor pattern, with an underfill being filled into a space between the mounted electronic part and said cover layer, and an underfill diffusion preventing portion constructed by forming a portion where said cover layer is removed in a trench shape to thereby surround the entire periphery of said electronic part mounting portion;
a head carriage connected electrically to said wiring board, said head carriage having a magnetic head mounted thereon and configured to perform input/output of electric signals; and
a magnetic disk on which reading/writing of magnetic information are performed by the magnetic head mounted on said head carriage.

8. A magnetic disk apparatus as set forth in claim 7,
wherein said underfill diffusion preventing portion is formed to be at least double.

9. A magnetic disk apparatus as set forth in claim 7,
wherein said underfill diffusion preventing portion is formed in a non-linear shape.

10. A magnetic disk apparatus as set forth in claim 7, further comprising:
a partial underfill diffusion preventing portion constructed on an outer side of said underfill diffusion preventing portion by forming a portion where said cover layer is removed in a trench shape only on a part of the periphery of said electronic part mounting portion.

11. A magnetic disk apparatus as set forth in claim 7,
wherein said cover layer is constituted of photosensitive polyimide.

12. A magnetic disk apparatus as set forth in claim 10,
wherein said conductor pattern is formed on a base layer, and said underfill diffusion preventing portion is constructed by removing said cover layer and said base layer in a trench shape.

* * * * *